(12) United States Patent
Kaneko et al.

(10) Patent No.: US 10,508,361 B2
(45) Date of Patent: Dec. 17, 2019

(54) METHOD FOR MANUFACTURING SEMICONDUCTOR WAFER

(71) Applicant: KWANSEI GAKUIN EDUCATIONAL FOUNDATION, Nishinomiya-shi, Hyogo (JP)

(72) Inventors: Tadaaki Kaneko, Sanda (JP); Yasunori Kutsuma, Sanda (JP); Koji Ashida, Sanda (JP)

(73) Assignee: KWANSEI GAKUIN EDUCATIONAL FOUNDATION, Nishinomiya-shi (JP)

(*) Notice: Subject to any disclaimer, the term of this patent is extended or adjusted under 35 U.S.C. 154(b) by 92 days.

(21) Appl. No.: 15/772,884

(22) PCT Filed: Nov. 8, 2016

(86) PCT No.: PCT/JP2016/004832
§ 371 (c)(1),
(2) Date: May 2, 2018

(87) PCT Pub. No.: WO2017/081862
PCT Pub. Date: May 18, 2017

(65) Prior Publication Data
US 2018/0312992 A1  Nov. 1, 2018

(30) Foreign Application Priority Data

Nov. 10, 2015 (JP) .................. 2015-220064

(51) Int. Cl.
*C30B 19/04* (2006.01)
*C30B 19/12* (2006.01)
(Continued)

(52) U.S. Cl.
CPC .............. *C30B 19/04* (2013.01); *C30B 19/12* (2013.01); *C30B 29/36* (2013.01);
(Continued)

(58) Field of Classification Search
CPC .......... C30B 19/02; C30B 19/03; C30B 29/36
See application file for complete search history.

(56) References Cited

U.S. PATENT DOCUMENTS 9,234,297 B2 *   1/2016  Sato .................. C30B 29/36
2010/0119849 A1 * 5/2010  Nakamura .............. C30B 25/20
                                                         428/446
(Continued)

FOREIGN PATENT DOCUMENTS

JP     2008-230946 A    10/2008
JP     2010-265126 A    11/2010
(Continued)

OTHER PUBLICATIONS

International Search Report dated Dec. 6, 2016, issued in counterpart application No. PCT/JP2016/004832. (1 page).
(Continued)

*Primary Examiner* — Robert M Kunemund
(74) *Attorney, Agent, or Firm* — Westerman, Hattori, Daniels & Adrian, LLP

(57) ABSTRACT

In a first step, protrusions (42) are formed on a surface of an SiC substrate (40), and the SiC substrate (40) is etched. In a second step, the protrusions (42) of the SiC substrate (40) are epitaxially grown through MSE process, and an epitaxial layer (43a) containing threading screw dislocation, which has been largely grown in the vertical (c-axis) direction as a result of MSE process, is at least partially removed. In a third step, MSE process is performed again on the SiC substrate (40) after the second step, to cause epitaxial layers (43) containing no threading screw dislocation to be grown in the horizontal (a-axis) direction to be connected at the molecular level, so that one monocrystalline 4H—SiC semiconductor wafer (45) having a large area is generated throughout an Si-face or a C-face of the SiC substrate (40).

11 Claims, 16 Drawing Sheets

After first MSE growth (abnormal growth of TSD portion)

(51) Int. Cl.
*C30B 29/36* (2006.01)
*H01L 21/02* (2006.01)
*H01L 29/04* (2006.01)
*H01L 29/16* (2006.01)

(52) U.S. Cl.
CPC .... *H01L 21/0243* (2013.01); *H01L 21/02378* (2013.01); *H01L 21/02529* (2013.01); *H01L 21/02609* (2013.01); *H01L 21/02625* (2013.01); *H01L 29/045* (2013.01); *H01L 29/1608* (2013.01)

(56) References Cited

U.S. PATENT DOCUMENTS

2014/0319539 A1* 10/2014 Kaneko .................. C30B 19/04
  257/77
2017/0114475 A1* 4/2017 Yabuki .................... C30B 19/12

FOREIGN PATENT DOCUMENTS

| JP | 2012-176867 A | 9/2012 |
| JP | 2012-193055 A | 10/2012 |
| JP | 2013-43822 A | 3/2013 |

OTHER PUBLICATIONS

Nishitani et al., "Metastable solvent epitaxy of SiC", Journal of Crystal Growth, 310, 2008, pp. 1815-1818 (5 pages).

* cited by examiner

Before laser machining

Forming protrusions (mesa structure) by laser

Planarize surface by etching under Si vapor pressure

Before starting first MSE process

After first MSE growth (abnormal growth of TSD portion)

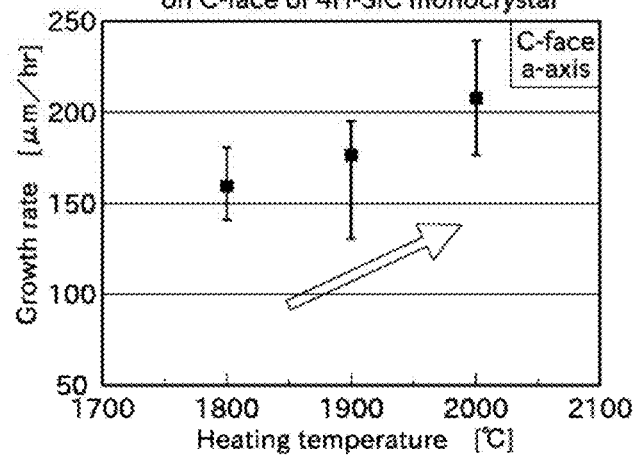
Fig. 9A Variation in growth rate in a-axis (horizontal) direction on C-face of 4H-SiC monocrystal
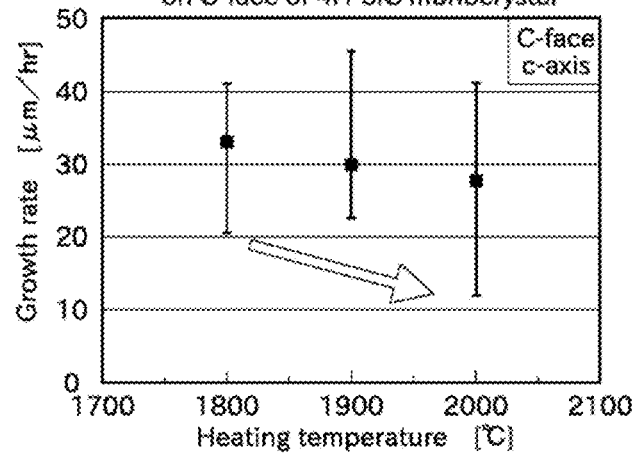
Fig. 9B Variation in growth rate in c-axis (vertical) direction on C-face of 4H-SiC monocrystal Remove TSD-containing portion by laser After second MSE growth (epitaxial layers are connected)

Modified Example in which protrusions are arranged in different manner

Fig.13
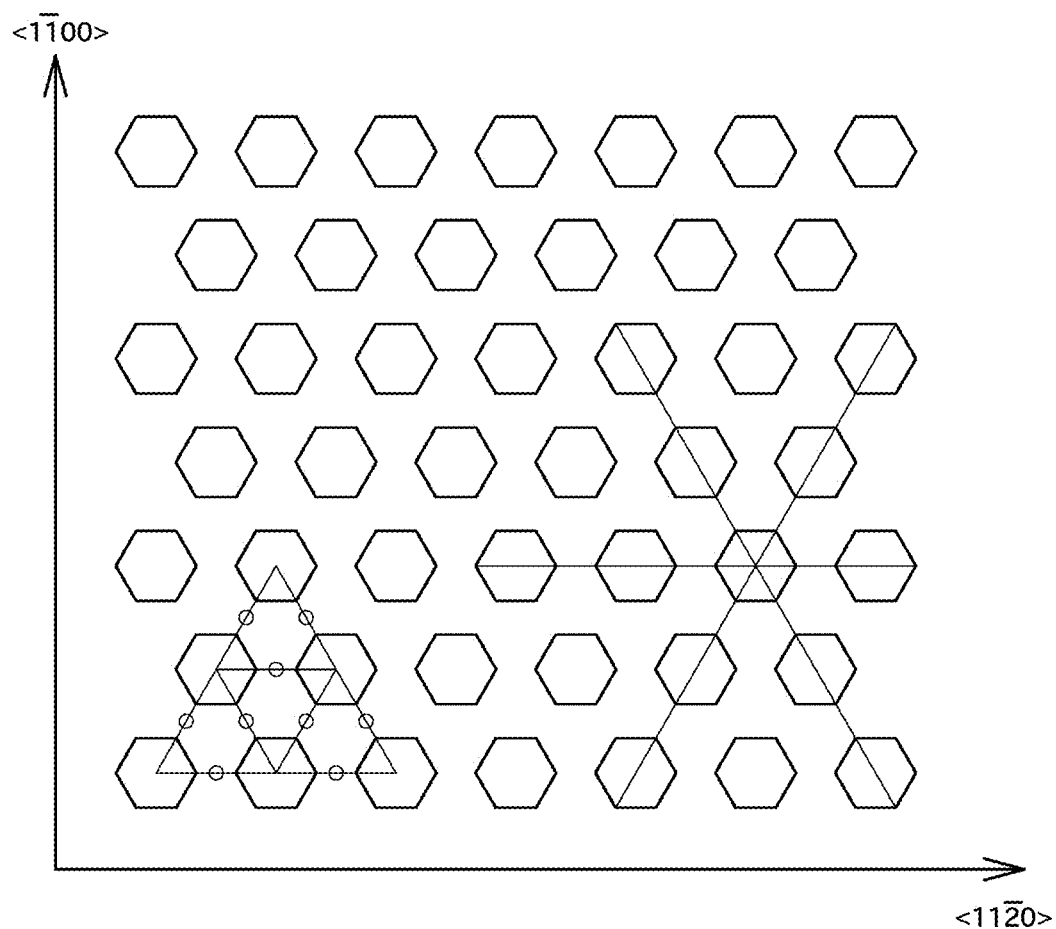
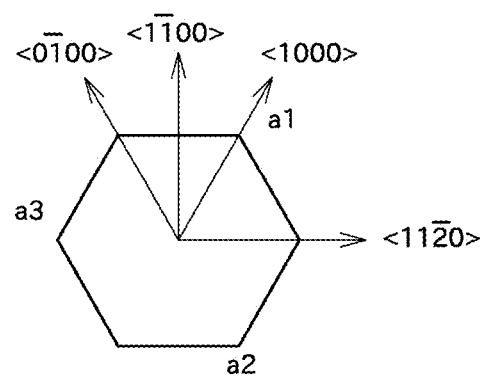

METHOD FOR MANUFACTURING SEMICONDUCTOR WAFER

TECHNICAL FIELD

The present invention relates to a method for manufacturing a semiconductor element with an SiC substrate.

BACKGROUND ART

Silicon (Si), gallium arsenide (GaAs), and the like, are conventionally known semiconductor materials. Recently, the field of use of semiconductor elements is rapidly expanding. The semiconductor elements are accordingly more often used under severe conditions such as a high temperature environment. Achievement of a semiconductor element that is able to withstand a high temperature environment is one of important issues from the viewpoint of a reliable operation, processing of a large amount of information, and improvement in controllability in wide ranges of applications.

Silicon carbide (SiC) is of interest as one of materials that can be used for manufacturing a semiconductor element having an excellent heat resistance. SiC has an excellent mechanical strength and a radiation hardness. Adding impurities to SiC enables a valence electron such as an electron or a hole to be easily controlled, and SiC is characterized by having a large band gap width (3.2 eV in 4H monocrystalline SiC). For this reason, SiC is expected as a material for a next-generation power device that achieves a high temperature resistance, a high frequency resistance, a high voltage resistance, and a high environment resistance, which cannot be achieved by the existing semiconductor material described above. Patent Literature 1 to 3 (PTLs 1 to 3) disclose methods for manufacturing semiconductor materials with SiC.

PTL 1 discloses a method for manufacturing a high-quality SiC semiconductor, in which the temperature in a growth furnace for the growth of a seed crystal is made uniform so that generation of SiC polycrystals is suppressed. PTL 2 discloses a method for manufacturing a high-quality SiC semiconductor with less defects, in which a plurality of recesses are formed in a seed crystal.

Non-Patent Literature 1 (NPL 1) discloses Metastable Solvent Epitaxy (MSE) process which is a technique developed by the applicant of the present application. In MSE process which is a sort of solution growth technique, a seed substrate, a feed substrate having a higher free energy than that of the seed substrate, and an Si melt are used. The seed substrate and the feed substrate are arranged opposed to each other with the Si melt interposed therebetween, and in such a state, are heated under vacuum, so that monocrystalline SiC can be epitaxially grown on a surface of the seed substrate. In MSE process, there is no need to generate a temperature gradient in a monocrystalline SiC growth direction during heating, and epitaxial growth progresses due to a concentration gradient which is determined by a difference in the free energy. In MSE process, the seed substrate need not have an off-angle. PTL 3 discloses a method for manufacturing an SiC semiconductor using MSE process.

CITATION LIST

Patent Literature

PTL 1: Japanese Patent Application Laid-Open No. 2012-193055

PTL 2: Japanese Patent Application Laid-Open No. 2012-176867

PTL 3: Japanese Patent Application Laid-Open No. 2008-230946

Non-Patent Literature

NPL 1: Tadaaki Kaneko et al, "Metastable Solvent Epitaxy of SiC" Journal of Crystal Growth 310 (2008) 1815-1818

SUMMARY OF INVENTION

Technical Problem

A semiconductor material including SiC is manufactured using a bulk substrate cut out from an ingot of monocrystalline SiC of 4H—SiC or 6H—SiC. The bulk substrate needs to have its surface planarized by, for example, mechanical polishing. The mechanical polishing, however, causes polishing flaws in the submicron order, and therefore the mechanical polishing is conventionally followed by chemical-mechanical polishing to remove the polishing flaws, for further planarization of the substrate.

Then, a 4H—SiC monocrystalline epitaxial layer is formed on the substrate surface by MSE process or the like, and the substrate surface is planarized at the molecular level, is implanted with ions, and is heated at a high temperature to activate the ions. For example, in a step of growing the epitaxial layer, a part of a surface of the epitaxial layer may be largely roughened. This lowers the yield of semiconductor wafers. Particularly, as a semiconductor wafer used for producing a semiconductor element has a larger size, the semiconductor wafer is more likely to have a partial surface roughness. The presence of the surface roughness, even though it is partial, hinders sufficient exertion of the performance as the semiconductor wafer. This is why manufacturing a large-size semiconductor wafer is difficult.

The applicant of the present application conducted an analysis on the roughness of the epitaxial layer, to discover that it is caused by occurrence of threading screw dislocation in the substrate. In a step of producing an ingot, heating is performed while a temperature gradient is given, for crystal growth. Due to the temperature gradient in the crystal, however, threading screw dislocation occurs in the substrate. If, for example, MSE process is performed on a portion containing the threading screw dislocation, the threading screw dislocation is transferred up to a surface of the epitaxial layer, which causes surface roughness.

The present invention has been made in view of the circumstances described above, and a primary object of the present invention is to provide a semiconductor wafer manufacturing method in which an epitaxial layer is grown by using MSE process, the method being a method for manufacturing a large-size semiconductor wafer containing few crystal defects.

Solution to Problem and Advantageous Effects

Problems to be solved by the present invention are as described above. Solutions to the problems and advantageous effects thereof will now be described.

An aspect of the present invention provides a method for manufacturing a semiconductor wafer, the method including a first step, a second step, and a third step. In the first step, protrusions are formed on a surface of an SiC substrate, and the SiC substrate is heated under Si vapor pressure, so that the SiC substrate is etched. In the second step, a carbon feed member is arranged on the protrusion side of the SiC substrate after the first step with an Si melt interposed therebetween; then heating is performed so that the protrusions of the SiC substrate are epitaxially grown to form epitaxial layers through metastable solvent epitaxy process, the epitaxial growth allowing an epitaxial layer containing threading screw dislocation to be more largely grown in a vertical (c-axis) direction as compared with an epitaxial layer containing no threading screw dislocation; and then at least a part of the epitaxial layer containing threading screw dislocation is removed. In the third step, metastable solvent epitaxy process is performed again on the SiC substrate after the second step, to cause epitaxial layers containing no threading screw dislocation to be grown in a horizontal (a-axis) direction to be connected at a molecular level, so that at least one monocrystalline 4H—SiC semiconductor wafer having a large area is generated on an Si-face (0001 face) or a C-face (000-1 face) which is a surface of the SiC substrate.

Since the protrusion containing threading screw dislocation which can be a cause of surface roughness is largely grown in the vertical direction at a time of the epitaxial growth, it is distinguishable from the protrusion containing no threading screw dislocation. This makes it possible to preliminarily remove the threading screw dislocation which can be a cause of surface roughness. Removal of the epitaxial layer containing threading screw dislocation results in an increased interval between the protrusions, but this does not matter because other epitaxial layers are grown in the horizontal direction and are connected to one another to cover the interval. Accordingly, a large-area semiconductor wafer containing few crystal defects can be manufactured.

In the method for manufacturing a semiconductor wafer, it is preferable that: the SiC substrate has an off-angle of 0° or close to 0°; and in the metastable solvent epitaxy process performed in the second step and the third step, polycrystalline 3C—SiC is adopted as the carbon feed member, a heating temperature is set to 1600° C. or more and 2000° C. or less, and Si pressure is set to $10^{-5}$ Torr or more.

Since the MSE process can be performed under suitable conditions, sufficient epitaxial growth of the protrusions can be obtained.

In the method for manufacturing a semiconductor wafer, it is preferable that in the second step and the third step, epitaxial layers are formed on a C-face (000-1 face) or an Si-face (0001 face) of the SiC substrate through the metastable solvent epitaxy process.

In the method of the present invention, epitaxial layers can be grown on either the Si-face or the C-face, and therefore it is possible to form epitaxial layers on an appropriate face as needed.

In the method for manufacturing a semiconductor wafer, the following is preferable. In the first step, the SiC substrate is irradiated with laser to form a plurality of grooves crossing one another, thus forming protrusions on the SiC substrate. In the second step, the epitaxial layer containing threading screw dislocation is irradiated with laser, for removal of this epitaxial layer.

Thus, in the first step, a large number of protrusions can be formed by a simple process. In the second step, the epitaxial layer containing threading screw dislocation can be removed by a simple process. In particular, both of the operations necessary for the first step and the second step are implemented by the laser apparatus, and therefore the operation efficiency can be improved.

In the method for manufacturing a semiconductor wafer, protrusions having the following configuration are preferably formed. Each of the protrusions has a rectangular upper surface. Each of the protrusions has a length of 20 μm to 40 μm in the vertical (c-axis) direction. One side of the upper surface of each of the protrusions has a length of 50 μm to 100 μm in the horizontal (a-axis) direction. The interval at which adjacent ones of the protrusions are formed is 400 μm to 1000 μm.

This enables the epitaxial growth to occur under suitable conditions, so that epitaxial layers can be connected.

In the method for manufacturing a semiconductor wafer, it is preferable that in the second step, the length of an epitaxial layer containing threading screw dislocation in the vertical (c-axis) direction is equal to or more than twice the length of an epitaxial layer containing no threading screw dislocation in the vertical (c-axis) direction.

In the method for manufacturing a semiconductor wafer, the following is preferable. An epitaxial layer grown from the protrusion containing threading screw dislocation has a length of about 250 μm in the vertical (c-axis) direction, and a length of about 400 μm in the horizontal (a-axis) direction. An epitaxial layer grown from the protrusion containing no threading screw dislocation has a length of about 100 μm in the vertical (c-axis) direction, and a length of about 400 μm in the horizontal (a-axis) direction.

This makes it easy to identify a portion containing threading screw dislocation and a portion containing no threading screw dislocation.

In the method for manufacturing a semiconductor wafer, it is preferable that in the third step, the metastable solvent epitaxy process is performed under a condition that enables an epitaxial layer containing no threading screw dislocation to be grown by 4 mm in the horizontal (a-axis) direction.

This provides sufficient growth of an epitaxial layer containing no threading screw dislocation, which can substantially ensure that epitaxial layers be connected even when the epitaxial layer containing threading screw dislocation is removed.

In the method for manufacturing a semiconductor wafer, it is preferable that the protrusions are formed in such a manner that imaginary lines each connecting the centers of adjacent ones of the protrusions form an equilateral triangle when the SiC substrate is viewed in a direction perpendicular to <1-100> direction and to <11-20> direction.

In the method for manufacturing a semiconductor wafer, it is preferable that in the second step and the third step, the metastable solvent epitaxy process is performed so as to cause the vertices of hexagonal shapes of epitaxial layers to contact each other.

This enables adjacent epitaxial layers to be connected under a suitable condition with a crystal orientation considered.

BRIEF DESCRIPTION OF DRAWINGS

FIGS. 9A and 9B are graphs showing the growth rates in a horizontal (a-axis) direction and in a vertical (c-axis) direction relative to the heating temperature.

FIG. 13 is a diagram showing an arrangement in which epitaxial layers are likely to be connected.

DESCRIPTION OF EMBODIMENTS

Hereinafter, an embodiment of the present invention will be described with reference to the drawings.

Figure 1:
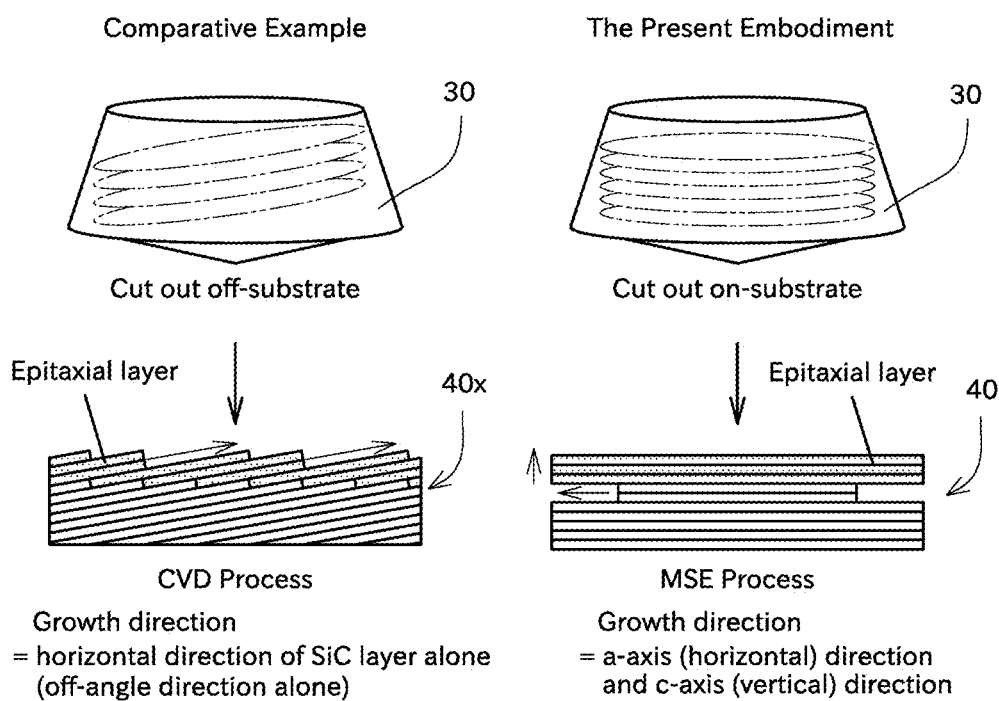
FIG. 1 is a diagram comparing formation of an epitaxial layer through CVD process and formation of an epitaxial layer through MSE process.

First, referring to FIG. 1, a method for cutting out an SiC substrate 40 from an ingot 30 and forming epitaxial layers will be briefly described. In a conventional method commonly used, an SiC substrate 40x is cut out from an ingot 30 with an angle (off-angle) of 4° or 8° relative to an SiC layer. Then, an epitaxial layer is grown on a surface of the SiC substrate 40x through CVD process. In the CVD process, an epitaxial layer grows in the horizontal direction of the SiC layer. It therefore is impossible to grow the epitaxial layer without providing the off-angle.

In this embodiment, on the other hand, an SiC substrate 40 is cut out from the ingot 30 in the direction parallel to the SiC layer. Then, protrusions, etc. are formed (details will be given later), and thereafter epitaxial layers are grown on a surface of the SiC substrate 40 through MSE process (Metastable Solvent Epitaxy process). Since MSE process allows an epitaxial layer to be grown in a-axis (horizontal) direction and in c-axis (vertical) direction, it is not necessary to provide an off-angle. In the method of this embodiment as well, a very small off-angle (close to 0°, for example, not more than 2° or not more than 4°) may be provided because of, for example, an error occurring when the SiC substrate 40 is cut out from the ingot 30.

Although the ingot 30 and the SiC substrate 40 is made of 4H—SiC in this embodiment, they may be made of SiC having another composition (e.g., 6H—SiC). The SiC substrate 40 manufactured by forming SiC on a surface of a substrate made of graphite or the like may also be adopted.

After being cut out from the ingot 30, the SiC substrate 40 has its surface polished by mechanical polishing, chemical-mechanical polishing, Si etching, and the like.

Figure 2A:
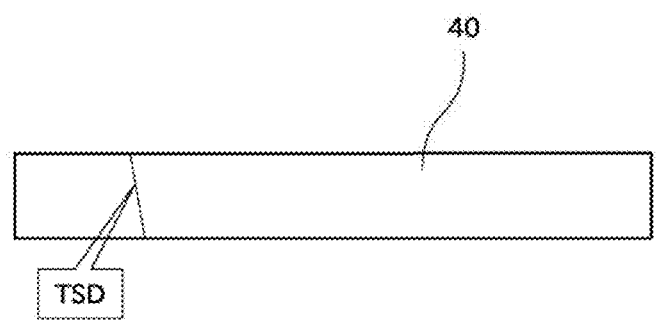
FIGS. 2A and 2B are cross-sectional and perspective views schematically showing an SiC substrate before laser machining is performed.
Figure 2B:
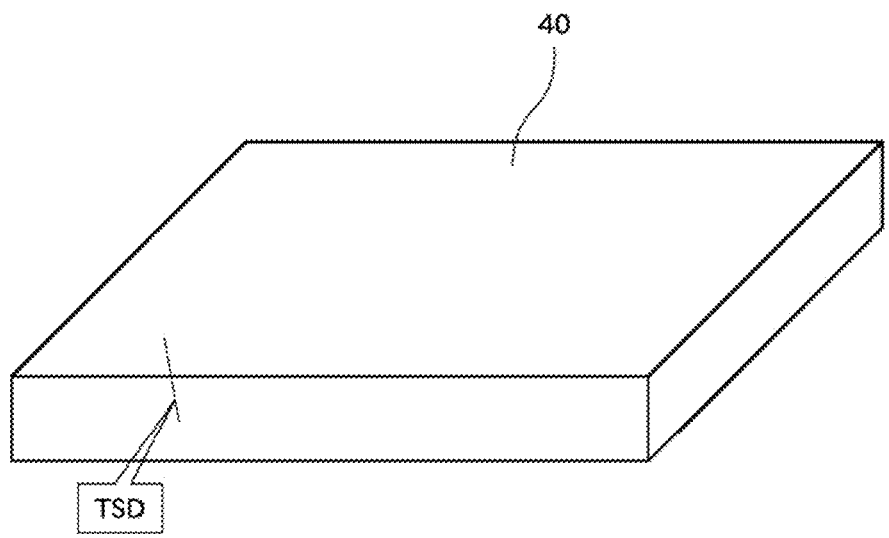

A step of manufacturing a semiconductor wafer using the SiC substrate 40 will now be described. In a step of forming the ingot 30, crystal growth is implemented by providing a temperature difference, but this temperature difference in a crystal may cause crystal defects to occur in the SiC substrate 40 (see FIGS. 2A and 2B). Examples of such crystal defects include threading screw dislocation (hereinafter, TSD). TSD is a crystal defect having a dislocation line parallel to a crystal displacement direction (Burgers vector).

Figure 3A:
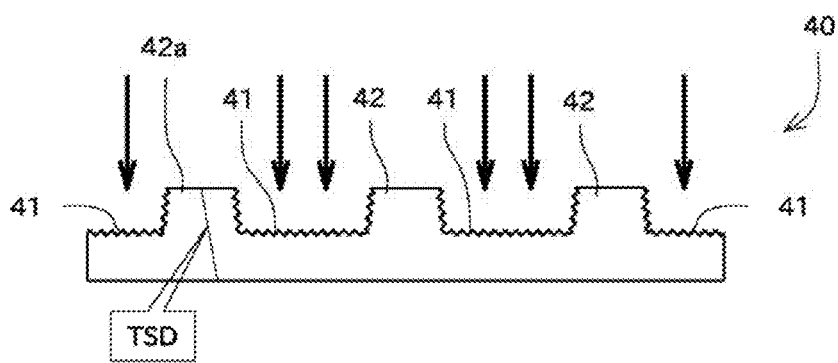
FIGS. 3A and 3B are cross-sectional and perspective views schematically showing an SiC substrate after protrusions are formed by laser machining.
Figure 3B:
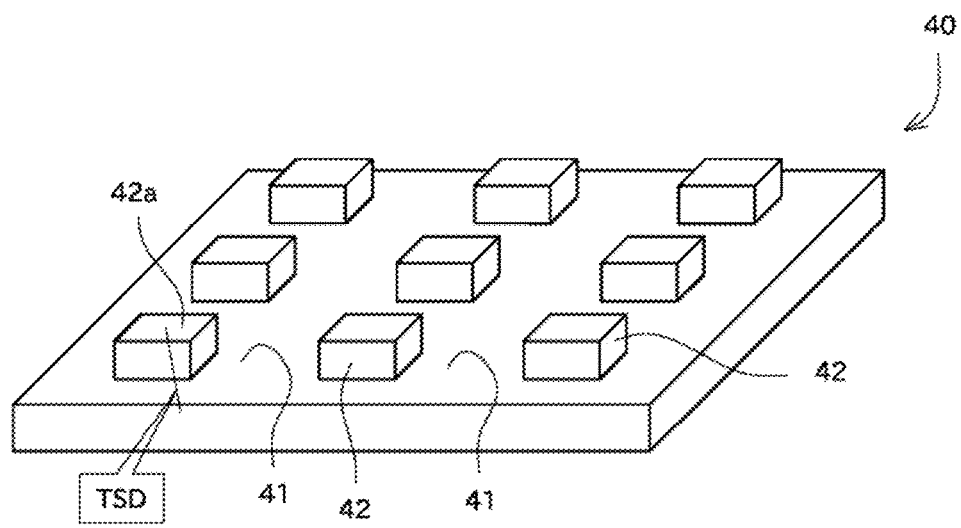

First, the SiC substrate 40 is irradiated with laser, so that protrusions 42 are formed on the surface of the SiC substrate 40 (FIGS. 3A and 3B; first half of first step). To be specific, a laser apparatus or the SiC substrate 40 is moved during irradiation of laser, to form a groove in the surface of the substrate 40. A plurality of such grooves are formed in parallel to one another, and a plurality of grooves crossing (for example, at right angles) the above-mentioned grooves are formed. In this manner, groove portions 41 and protrusions 42 are formed on the surface of the SiC substrate 40, as shown in FIGS. 3A and 3B. In the following, a protrusion containing TSD is denoted by the reference sign 42a, and a protrusion containing no TSD is denoted by the reference sign 42, as shown in FIGS. 3A and 3B.

The protrusion 42, whose upper surface and lower surface are rectangular, has a mesa structure (trapezoidal structure) in which the lower surface is larger. The shape and pitch (interval of formation) of the protrusions 42 are optional, but it is preferable that the height (vertical length) of the protrusion 42 is 20 µm to 40 µm, it is preferable that the width (length of one side of the upper surface in the horizontal direction) of the protrusion 42 is 50 µm to 100 µm, and it is preferable that the pitch of the protrusions 42 is 400 µm to 1000 µm. The protrusion 42 need not always have a mesa structure, and instead, may have a rectangular parallelepiped shape, a cubic shape, or other shapes.

The schematic diagrams of FIGS. 3A and 3B and the like are merely schematic illustration of the SiC substrate 40, and the shape, arrangement, etc. of the protrusions 42 are different from the actual ones. Although this embodiment adopts laser to form the protrusions 42, the protrusions 42 may be formed by another method. In this embodiment, a processing object surface (surface on which the protrusions 42 are formed) of the SiC substrate 40 is a 000-1 face (C-face), but the processing object surface of the SiC substrate 40 may be a 0001 face (Si-face).

Figure 4A:
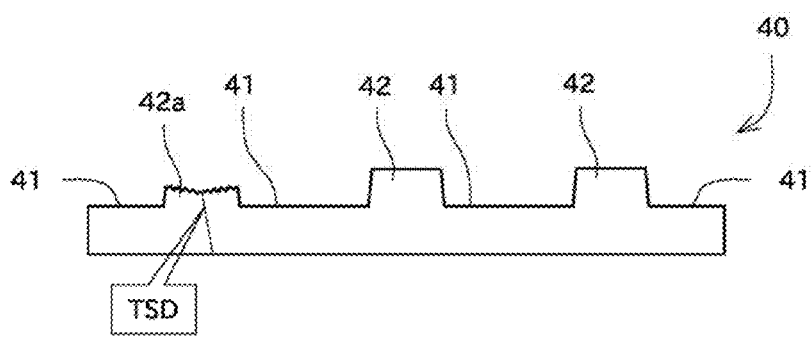
FIGS. 4A and 4B are cross-sectional and perspective views schematically showing an SiC substrate after etching is performed under Si vapor pressure.
Figure 4B:
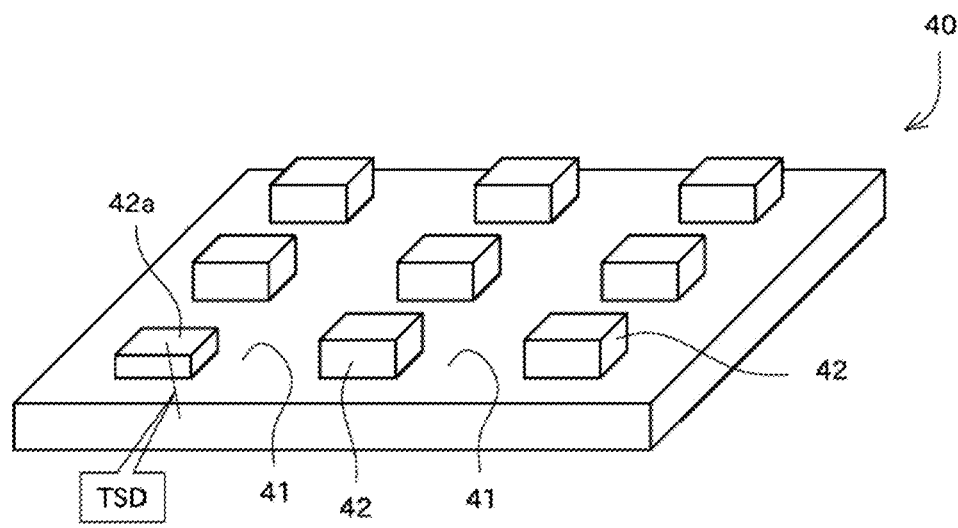

Then, Si etching is performed on the SiC substrate 40 having the protrusions 42 formed thereon (FIGS. 4A and 4B; last half of first step). The Si etching is a process for etching the surface of the SiC substrate 40, in which the SiC substrate 40 is heated under Si vapor pressure at a high temperature (1600° C. or more and 2300° C. or less). Performing the Si etching on the SiC substrate 40 planarizes the surface of the SiC substrate 40 at the molecular level. More specifically, SiC of the SiC substrate 40 becomes $Si_2C$, $SiC_2$, etc. and sublimates, while Si of Si atmosphere binds with C in the surface of the SiC substrate 40 to cause self-assembly, so that planarization occurs. Performing the Si etching may sometimes cause the protrusion 42a containing TSD to be excessively etched as compared with the other protrusions 42, as shown in FIGS. 4A and 4B.

Figure 5A:
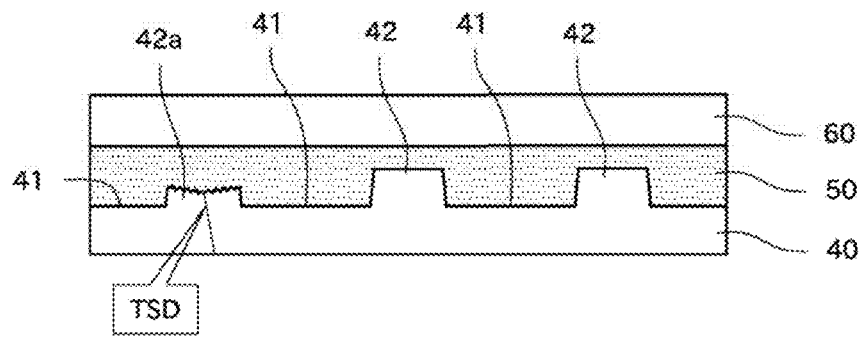
FIGS. 5A and 5B are cross-sectional and perspective views schematically showing an SiC substrate after preparation of an Si melt and a carbon feed substrate (before epitaxial growth).
Figure 5B:
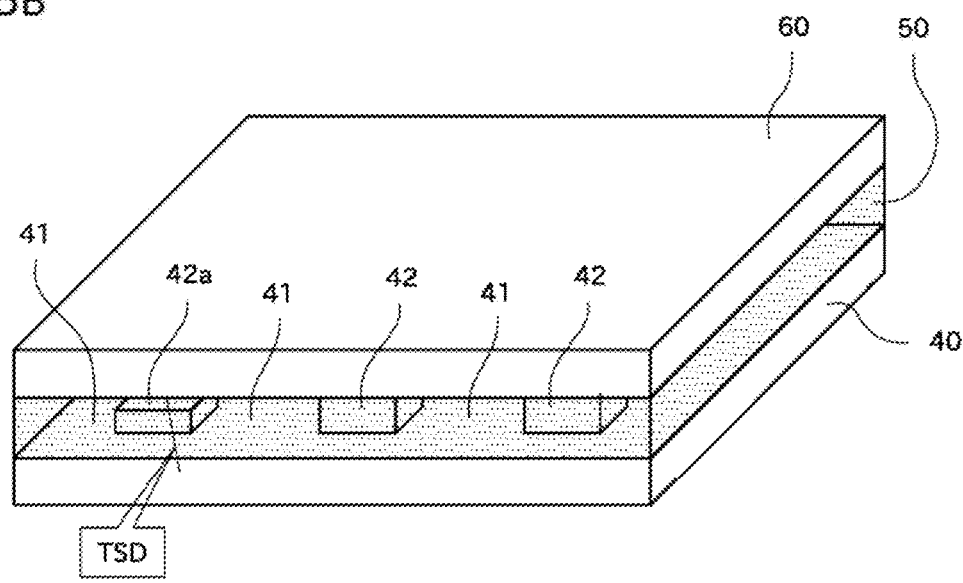

Then, the planarized SiC substrate 40 is subjected to first MSE process (FIGS. 5A and 5B; first half of second step). In MSE process which is a sort of solution growth technique, a seed substrate, a feed substrate having a higher free energy than that of the seed substrate, and an Si melt are used. The seed substrate and the feed substrate are arranged opposed to each other with the Si melt interposed therebetween, and in such a state, are heated under vacuum, so that monocrystalline SiC can be grown on a surface of the seed substrate. In this embodiment, the SiC substrate 40 corresponds to the seed substrate. An Si film is formed on the protrusion 42 side of the SiC substrate 40 through Si plating, CVD, or the like, then a carbon feed member 60 made of polycrystalline 3C—SiC is arranged on the upper side (protrusion 42 side) of the SiC substrate 40, and then heating is performed. In this embodiment, the carbon feed member 60 and the SiC substrate 40 have the same size in the horizontal direction, and have different thicknesses (their sizes in the horizontal direction may be slightly different, and their thicknesses may be equal).

Figure 6:
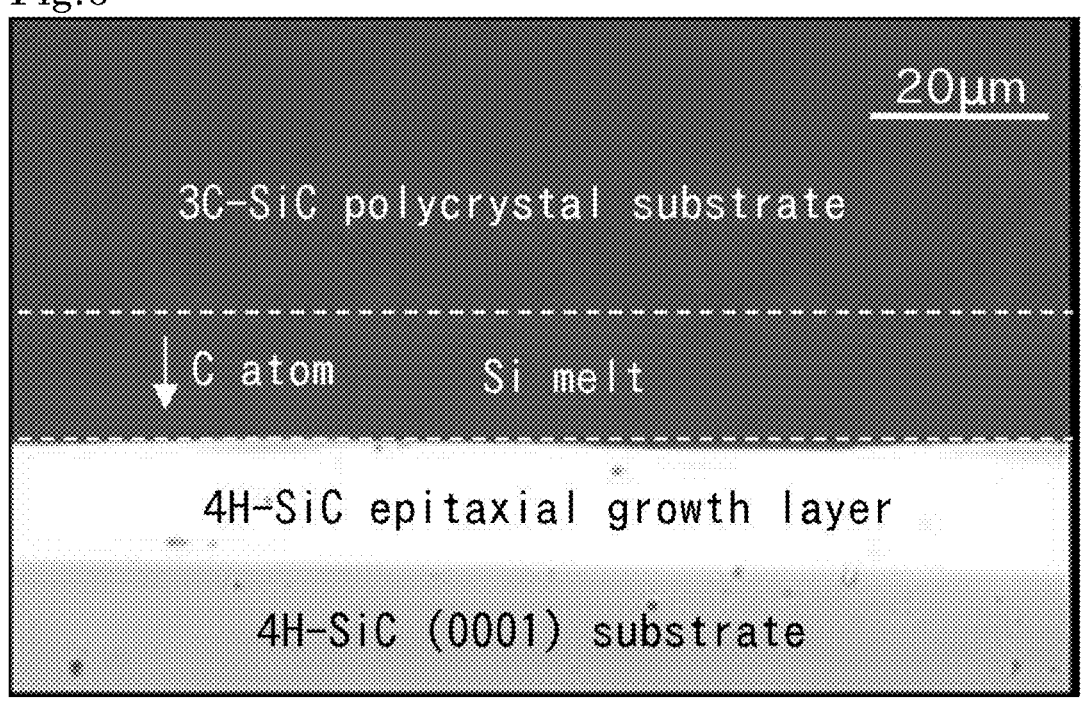
FIG. 6 is a photograph showing a cross-section of an SiC substrate after an epitaxial layer is formed through MSE process.

Preferable heating conditions are that the heating temperature is 1600° C. or more and 2000° C. or less, and Si pressure is $10^{-5}$ Torr or more. As a result of the heating, Si is melted into an Si melt 50. A concentration gradient is generated in the Si melt 50 because of a difference in the free energy between the SiC substrate 40 and the carbon feed member 60, and this concentration gradient acts as a drive force to elute C from the carbon feed member 60 into the Si melt 50. C that is taken into the Si melt 50 binds with Si of the Si melt 50, which is then deposited as monocrystalline SiC (epitaxial layer 43) on an upper surface of the SiC substrate 40. This state is shown in a photomicrograph of FIG. 6.

The protrusions 42 of the SiC substrate 40 are disposed at positions closer to the carbon feed member 60 than the groove portions 41. This generates a large concentration gradient, and therefore the epitaxial layers 43 are deposited primarily on the protrusions 42. In growth caused by MSE process, an epitaxial layer is grown in the a-axis (horizontal) direction and in the c-axis (vertical) direction.

Figure 7A:
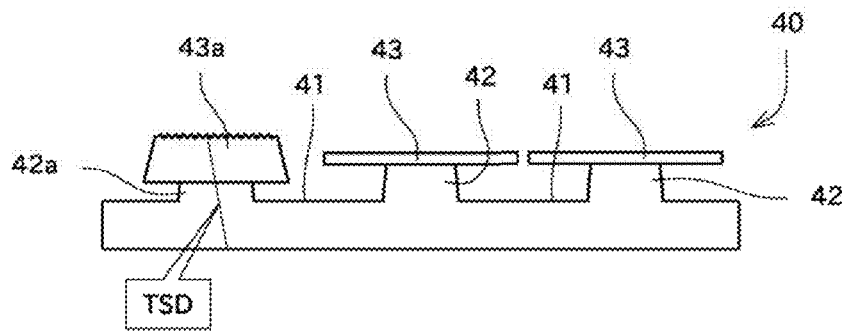
FIGS. 7A to 7C are cross-sectional and perspective views schematically showing an SiC substrate after epitaxial layers are formed through MSE process.
Figure 7B:
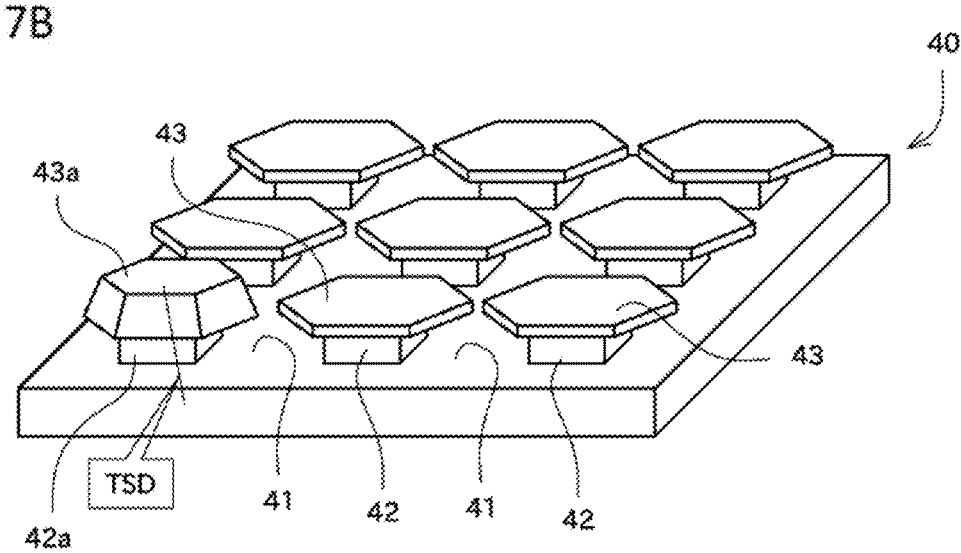
Figure 7C:
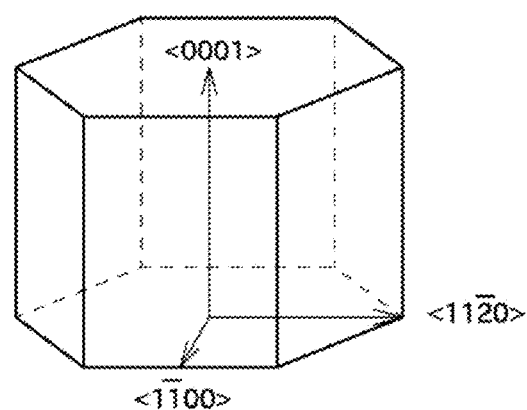
Figure 8:
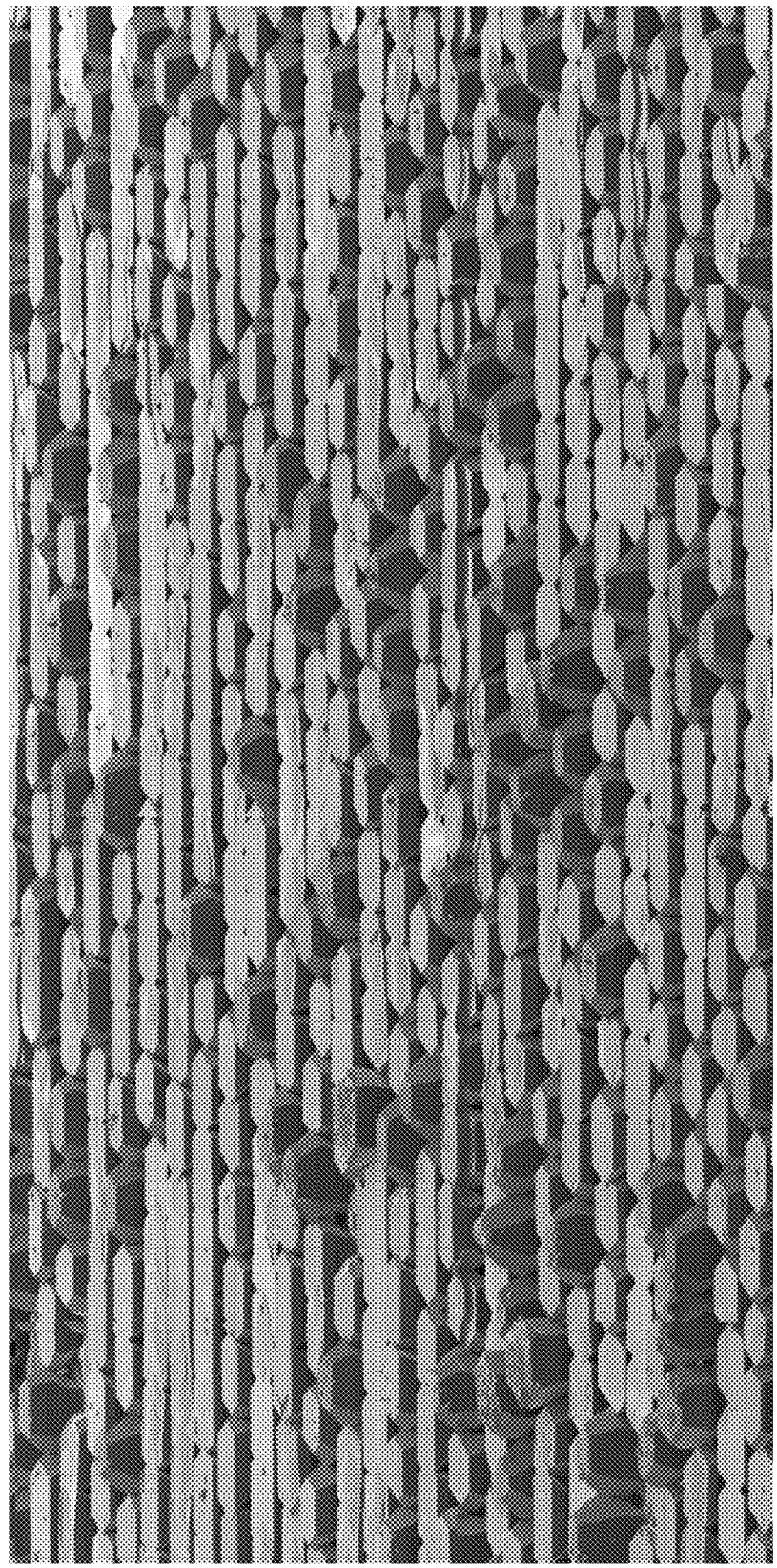
FIG. 8 is a photograph showing the upper side of an SiC substrate after epitaxial layers are formed through MSE process (heating temperature was 1800° C.; heating time was three hours).

As shown in FIGS. 7A to 7C, an epitaxial layer 43a grown from the protrusion 42a containing TSD has a large length in the c-axis (vertical) direction than that of the epitaxial layer 43 grown from the protrusion 42 containing no TSD. This state can be seen from a photomicrograph of FIG. 8. FIG. 8 is a photomicrograph showing a state where the epitaxial layers 43 were grown by heating an Si-face of 4H—SiC at 1800° C. for three hours. In FIG. 8, the epitaxial layers 43a containing TSD are colored darker than the other epitaxial layers 43.

The epitaxial layer 43 containing no TSD grows in a manner shown in graphs of FIGS. 9A and 9B. FIGS. 9A and 9B show the relationship between the growth rate on a C-face of a 4H—SiC monocrystal and the heating temperature. The vertical axis represents the growth rate of a 4H—SiC monocrystal, and the horizontal axis represents the heating temperature. The graphs of FIGS. 9A and 9B indicate that the growth rate in the a-axis (horizontal) direction is higher than the growth rate in the c-axis (vertical) direction. This is why the epitaxial layer 43 having a larger length in the horizontal direction than in the thickness direction is formed. As the heating temperature rises, the growth rate in the a-axis (horizontal) direction tends to increase and the growth rate in the c-axis (vertical) direction tends to decrease. Thus, the ratio of the growth rates can be adjusted by changing the heating temperature.

In a case of the epitaxial layer 43a grown from the protrusion 42a containing TSD, the TSD propagates to the grown epitaxial layer 43a. The applicant of the present application has confirmed that the growth rate of the epitaxial layer 43a is different from that of the epitaxial layer 43 containing no TSD. To be specific, when heating for three hours in MSE process resulted in the epitaxial layer 43 having a length (growing length) of about 100 μm in the vertical (c-axis) direction and a length of about 400 μm in the horizontal (a-axis) direction, the epitaxial layer 43a containing TSD had a length of about 250 μm in the vertical (c-axis) direction and a length of about 400 μm in the horizontal (a-axis) direction. The length of the epitaxial layer 43a in the vertical (c-axis) direction is equal to or more than twice the length of the epitaxial layer 43 in the vertical (c-axis) direction. It therefore is possible to clearly see whether or not an epitaxial layer is a TSD-containing portion.

Figure 10A:
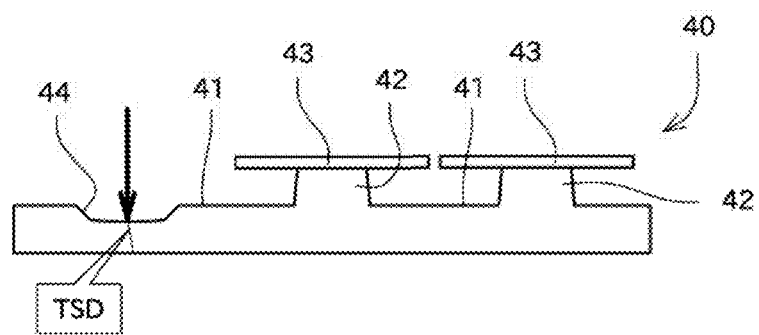
FIGS. 10A and 10B are cross-sectional and perspective views schematically showing an SiC substrate after a portion containing threading screw dislocation is removed by laser.
Figure 10B:
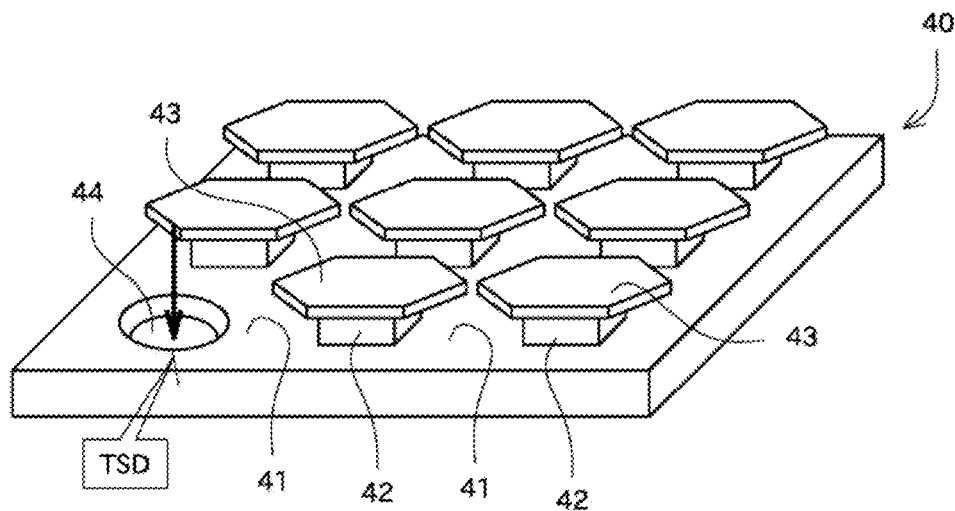

After the first MSE process, a process for removing the epitaxial layer 43a which is a TSD-containing portion is performed (FIGS. 10A and 10B; last half of second step). This process is performed by taking out the SiC substrate 40 from a heating apparatus and then, based on the heights of the epitaxial layers 43, irradiating with laser the epitaxial layer 43a which is higher than the other epitaxial layers 43 in the vertical (c-axis) direction. As a result of the irradiation of laser, the protrusion 42a and the epitaxial layer 43a are removed, and a cavity portion 44 is formed. In this step, complete removal of the protrusion 42a and the epitaxial layer 43a may not always be required, as long as they have no influence on subsequent MSE process. It may be also acceptable that the epitaxial layer 43a is removed by something other than laser.

Figure 11A:
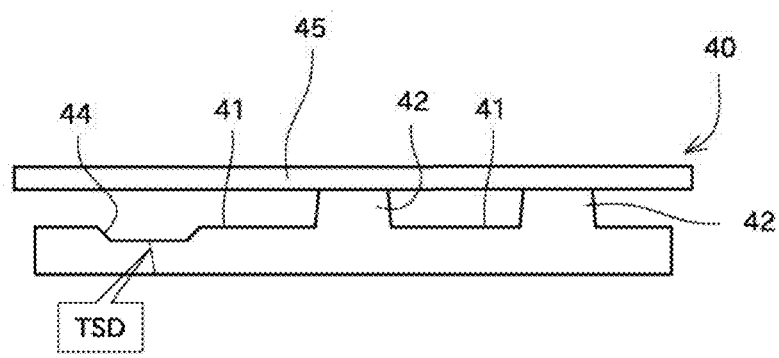
FIGS. 11A and 11B are cross-sectional and perspective views schematically showing an SiC substrate on which epitaxial growth layers are connected to form a large-size semiconductor wafer.
Figure 11B:
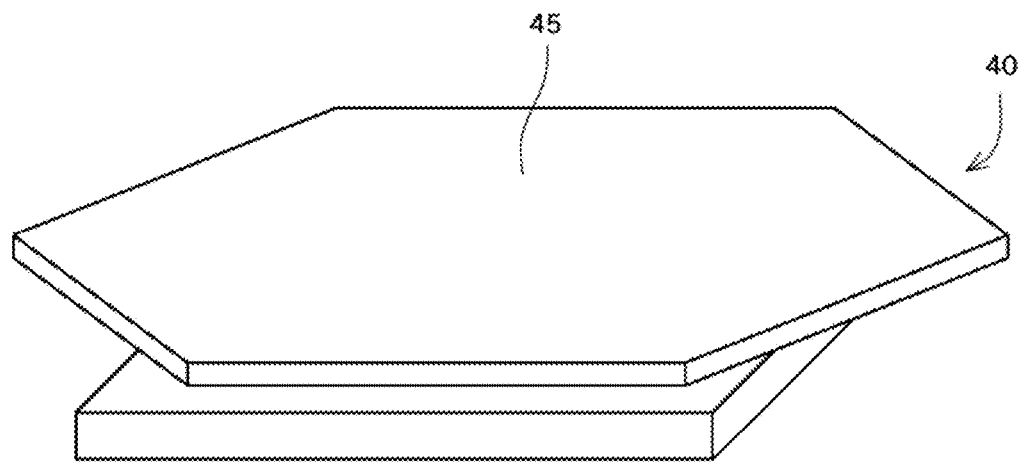

Then, the SiC substrate 40 is put into the heating apparatus again, and second MSE process is performed (FIGS. 11A and 11B; third step). As a result, the epitaxial layers 43 grown from the protrusions 42 are connected at the molecular level, so that the semiconductor wafer 45 is manufactured. In the third step, the epitaxial layers 43 are grown for a longer time period than in the second step. To be specific, MSE process is performed under a condition that enables an epitaxial layer containing no TSD to be grown by 4 mm in the horizontal (a-axis) direction (for example, under the condition that the heating time is 20 hours). Since a heat treatment is performed for a long time; even if the epitaxial layer 43a has been removed in the second step, adjacent another epitaxial layer 43 can be grown in the horizontal direction to supplement a portion corresponding to the epitaxial layer 43a. In this manner, a single monocrystalline 4H—SiC semiconductor wafer 45 containing no crystal defects such as TSD and having a large size (larger area than conventional) in the horizontal direction can be generated on the entire surface of the SiC substrate 40. Here, the "large area" means that the area (area of the surface, namely, Si-face or C-face) is larger than that of the epitaxial layer 43 grown from one protrusion 42. In Description herein, the wording "the entire surface of the SiC substrate 40" of the SiC substrate 40 does not strictly mean the whole of the surface of the SiC substrate 40 alone, but defines a concept encompassing a slightly smaller region (e.g., a region on the SiC substrate 40 where the protrusion 42 is formed), for example.

Then, the semiconductor wafer 45 is subjected to an ion implantation process, an ion activation process, an electrode formation process, and the like, so that a semiconductor device is manufactured.

Figure 12A:
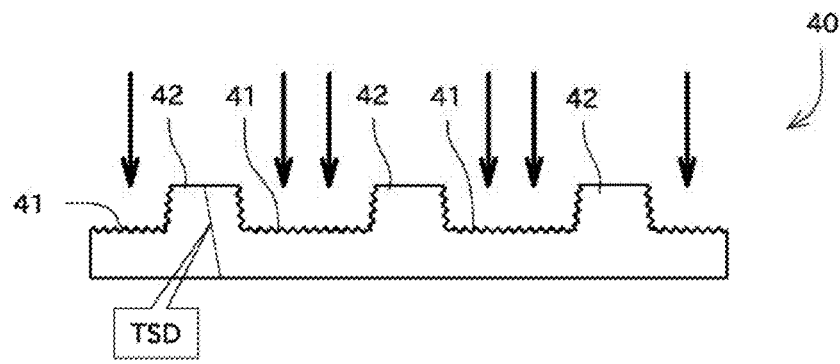
FIGS. 12A and 12B are diagrams showing another example of protrusions formed by laser machining.
Figure 12B:
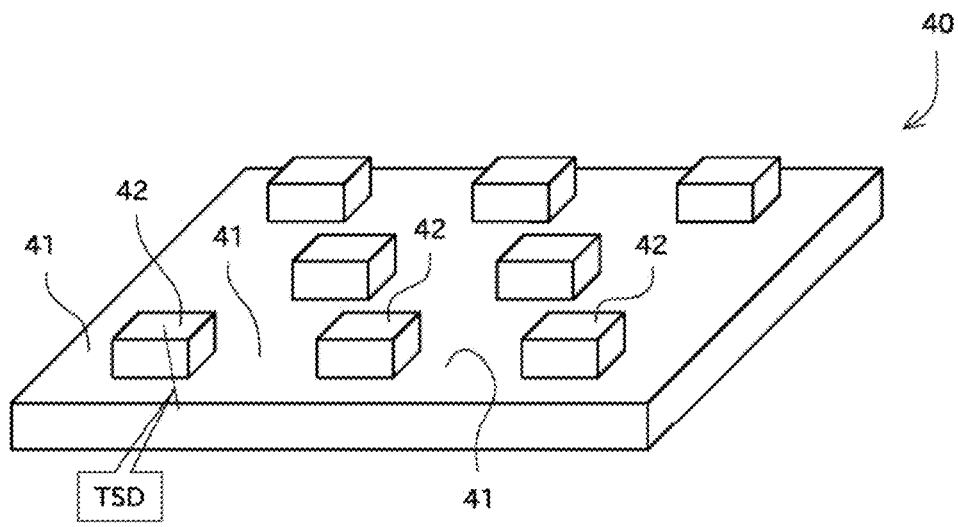

Although the above illustrates a configuration in which the groove portions 41 crossing at right angles are formed to provide the protrusions 42 on the SiC substrate 40, the groove portions 41 may be formed in a different manner. For example, grooves may cross one another at an angle other than right angles, as shown in FIGS. 12A and 12B.

Figure 14A:
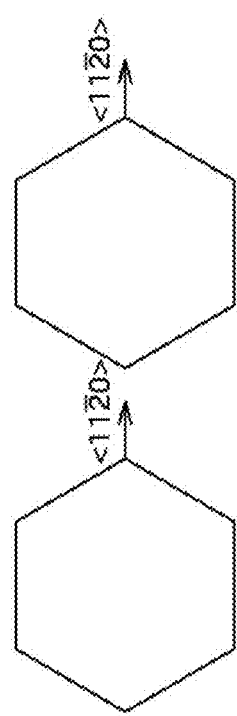
FIGS. 14A and 14B are diagrams showing a direction and a state in which epitaxial layers are connected.
Figure 14B:
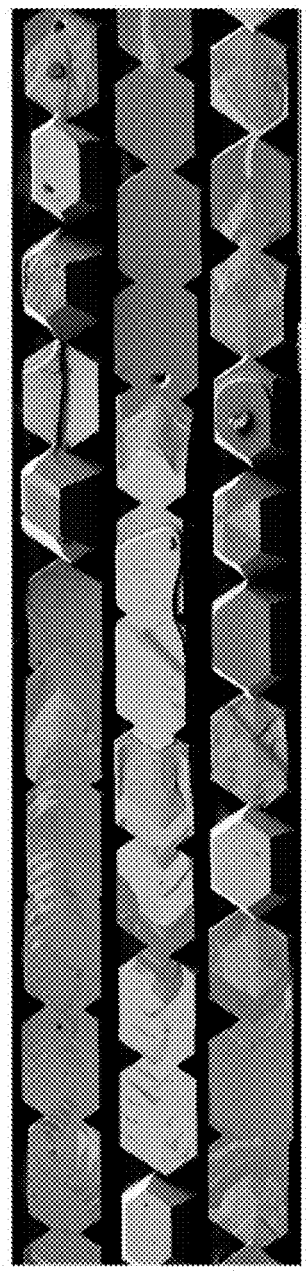

A condition under which the epitaxial layers 43 are likely to be connected at the molecular level will now be described with reference to FIGS. 13, 14A and 14B. FIG. 13 is a diagram showing an arrangement in which the epitaxial layers 43 are likely to be connected. FIGS. 14A and 14B are diagrams showing a direction and a state in which the epitaxial layers 43 are connected.

Experiments conducted by the applicant of the present application revealed that the epitaxial layers 43 are likely to be connected at the molecular level if the protrusions 42 are arranged such that imaginary lines each connecting the centers of adjacent ones of the epitaxial layers 43 form equilateral triangles when the SiC substrate 40 is viewed in the direction perpendicular to the <1-100> direction and to the <11-20> direction, as shown in FIG. 13.

Stated another way, as shown in FIG. 14A, performing MSE process so as to cause not the sides but the vertices of the hexagonal shapes of the epitaxial layers 43 to contact each other makes the epitaxial layers 43 likely to be connected at the molecular level. Although FIG. 14A shows that the epitaxial layers 43 are arranged side by side <11-20>, the epitaxial layers 43 may be arranged side by side in another direction as long as a positional relationship that allows the vertices to be connected is established. FIG. 14B shows a state in which the epitaxial layers 43 are connected.

Figure 15:
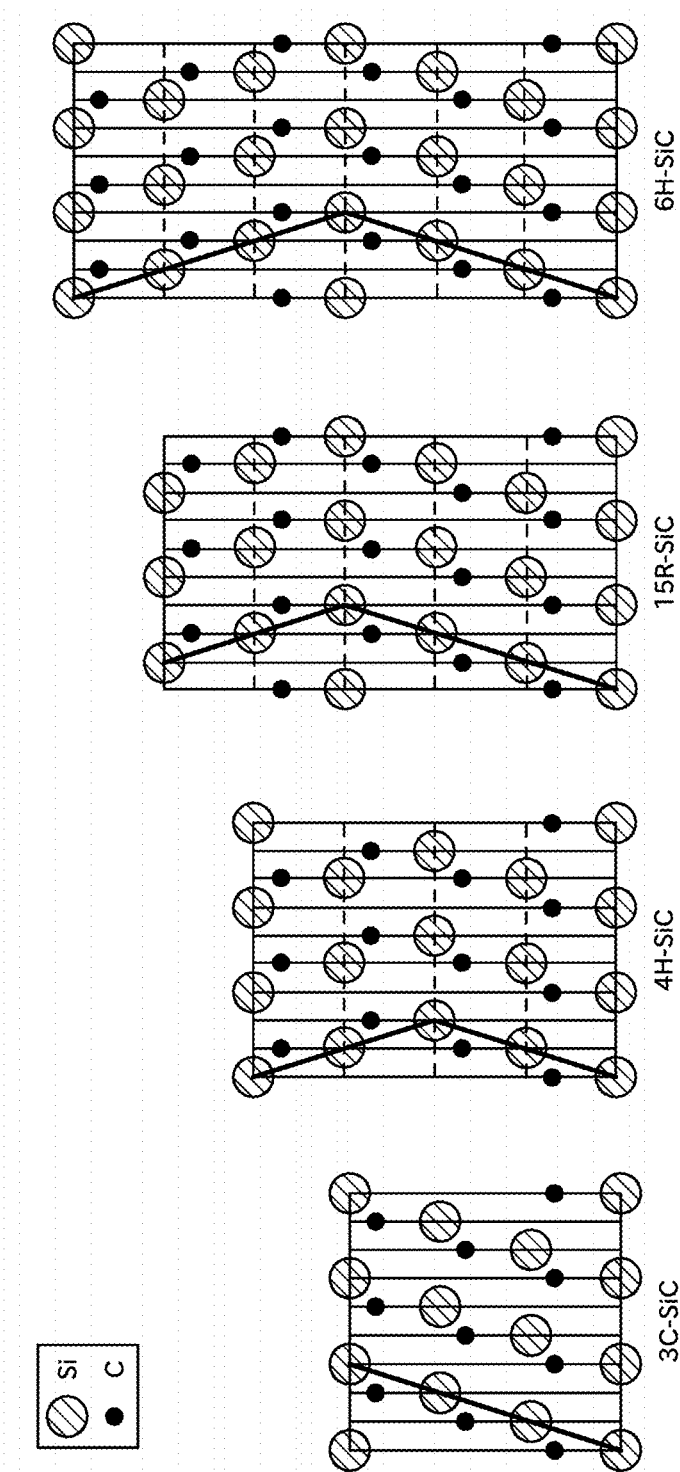
FIG. 15 is a diagram showing four types of SiC atomic arrangements.
Figure 16:
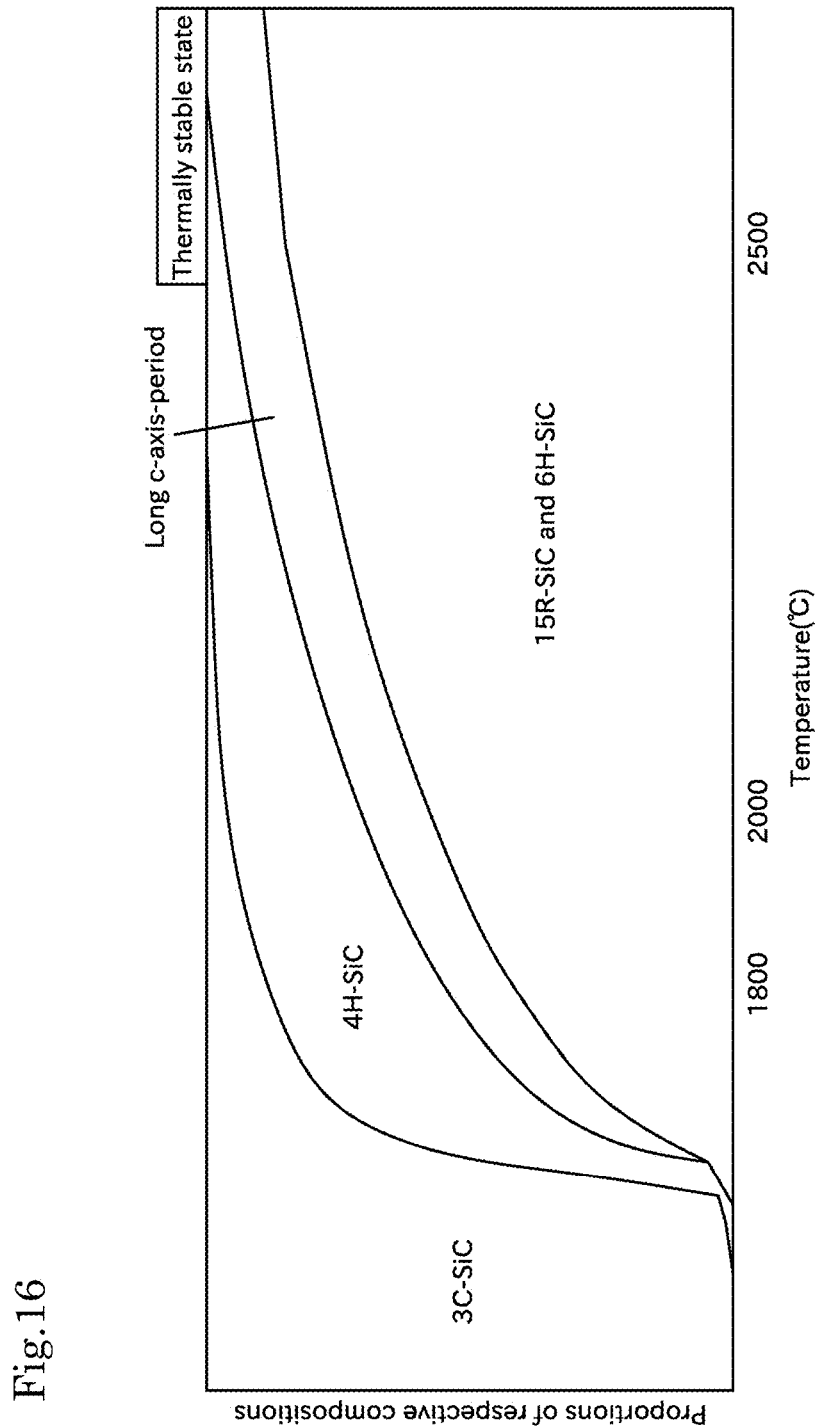
FIG. 16 is a graph showing that which type of SiC exists changes depending on the temperature.

A type of SiC generated in MSE process will now be described with reference to FIG. 15 and FIG. 16. FIG. 15 is a diagram showing four types of SiC atomic arrangements. FIG. 16 is a graph showing that which type of SiC exists changes depending on the temperature.

As shown in FIG. 15, four types of compositions of SiC are mainly known, namely, 3C—SiC, 4H—SiC, 15R—SiC, and 6H—SiC. SiC that is generated as a result of solution growth as exemplified by MSE process has different compositions depending on the temperature, as shown in FIG. 16. Particularly at and around 1800° C. as illustrated in this embodiment, SiC having any composition can be possibly generated.

In this embodiment, MSE process can be performed under a state where TSD contained in the SiC substrate 40 is removed, and therefore selective generation of 4H—SiC is enabled. Experiments conducted by the applicant of the present application have revealed that monocrystalline 4H—SiC is generated as epitaxial layers both when a seed substrate is 4H—SiC and when a seed substrate is 6H—SiC.

As thus far described above, this embodiment provides a method for manufacturing the semiconductor wafer 45, the method including the first step, the second step, and the third step described below. In the first step, the protrusions 42 are formed on the surface of the SiC substrate 40, and the SiC substrate 40 is heated under Si vapor pressure, so that the SiC substrate 40 is etched. In the second step, the carbon feed member 60 is arranged on the protrusion 42 side of the SiC substrate 40 after the first step with the Si melt 50 interposed therebetween, then heating is performed so that the protrusions 42 of the SiC substrate 40 are epitaxially grown through MSE process, the epitaxial growth allowing the epitaxial layer 43a containing TSD to be more largely grown in the vertical (c-axis) direction as compared with the epitaxial layer 43 containing no TSD, and then at least a part of the epitaxial layer 43a containing TSD is removed. In the third step, MSE process is performed again on the SiC substrate 40 after the second step, to cause the epitaxial layers 43 containing no TSD to be grown in the horizontal (a-axis) direction to be connected at the molecular level, so that one monocrystalline 4H—SiC semiconductor wafer 45 having a large area is generated throughout the Si-face (0001 face) or the C-face (000-1 face) of the SiC substrate 40.

Since a large growth can occur in the vertical direction at a time of the epitaxial growth, it is possible to preliminarily remove TSD which can be a cause of surface roughness. Removal of the epitaxial layer 43a containing TSD results in an increased interval between the epitaxial layers 43, but this interval can be covered by another epitaxial layer 43 grown in the horizontal direction. Accordingly, the large-size semiconductor wafer 45 containing few crystal defects can be manufactured.

In the method for manufacturing the semiconductor wafer 45 of this embodiment, in the first step, the SiC substrate 40 is irradiated with laser to form a plurality of grooves crossing one another, thus forming the protrusions 42 on the SiC substrate 40. In the second step, the epitaxial layer 43a containing TSD is irradiated with laser, for removal of this epitaxial layer 43a.

Thus, in the first step, a large number of protrusions 42 can be formed by a simple process. In the second step, the epitaxial layer 43a containing TSD can be removed by a simple process. In particular, both of the operations necessary for the first step and the second step are implemented by the laser apparatus, and therefore the operation efficiency can be improved.

While a preferred embodiment of the present invention has been described above, the configuration described above may be modified, for example, as follows.

As for the process performed on the SiC substrate 40 cut out from the ingot 30, though not described in detail in the above-described embodiment, for example, the following process can be performed. For example, the SiC substrate 40 cut out from the ingot 30 is firstly subjected to mechanical polishing. Then, a portion of the surface of the SiC substrate 40 failing to be planarized by the mechanical polishing and a machining-affected layer produced in the SiC substrate 40 as a result of the mechanical polishing are removed by Si etching or the like. This reduces a risk that roughness occurs in the surface of the SiC substrate 40 during heating, and thus a semiconductor wafer and a semiconductor device with a higher quality can be manufactured.

Although one semiconductor wafer 45 is formed in one SiC substrate 40 in the above-described embodiment, it may be possible to form a plurality of semiconductor wafers 45 in one SiC substrate 40.

The environment where the processing is performed, the monocrystalline SiC substrate used for the processing, and the like, are merely illustrative ones, and various environments and various monocrystalline SiC substrates are adoptable. For example, the heating temperature, the pressure, the shape of the protrusion 42, and the interval of the protrusions 42 are not limited to the ones illustrated above, but may be modified as appropriate.

REFERENCE SIGNS LIST

40 SiC substrate
41 groove portion
42, 42a protrusion
43, 43a epitaxial layer
45 semiconductor wafer

The invention claimed is:
1. A method for manufacturing a semiconductor wafer, the method comprising:
 a first step of forming protrusions on a surface of an SiC substrate and heating the SiC substrate under Si vapor pressure, to etch the SiC substrate;

a second step of arranging a carbon feed member on the protrusion side of the SiC substrate after the first step with an Si melt interposed therebetween, then heating so that the protrusions of the SiC substrate are epitaxially grown to form epitaxial layers through metastable solvent epitaxy process, the epitaxial growth allowing an epitaxial layer containing threading screw dislocation to be more largely grown in a vertical (c-axis) direction as compared with an epitaxial layer containing no threading screw dislocation, and then removing at least a part of the epitaxial layer containing threading screw dislocation; and a third step of performing metastable solvent epitaxy process again on the SiC substrate after the second step, to cause epitaxial layers containing no threading screw dislocation to be grown in a horizontal (a-axis) direction to be connected at a molecular level, so that at least one monocrystalline 4H—SiC semiconductor wafer having a large area is generated on an Si-face (0001 face) or a C-face (000-1 face) which is a surface of the SiC substrate.

2. The method for manufacturing a semiconductor wafer according to claim 1, wherein
the SiC substrate has an off-angle of 0° or close to 0°, and
in the metastable solvent epitaxy process performed in the second step and the third step, polycrystalline 3C—SiC is adopted as the carbon feed member, a heating temperature is set to 1600° C. or more and 2000° C. or less, and Si pressure is set to $10^{-5}$ Torr or more.

3. The method for manufacturing a semiconductor wafer according to claim 1, wherein
in the second step and the third step, epitaxial layers are formed on a C-face (000-1 face) of the SiC substrate through the metastable solvent epitaxy process.

4. The method for manufacturing a semiconductor wafer according to claim 1, wherein
in the second step and the third step, epitaxial layers are formed on an Si-face (0001 face) of the SiC substrate through the metastable solvent epitaxy process.

5. The method for manufacturing a semiconductor wafer according to claim 1, wherein
in the first step, the SiC substrate is irradiated with laser to form a plurality of grooves crossing one another, thus forming protrusions on the SiC substrate, and
in the second step, the epitaxial layer containing threading screw dislocation is irradiated with laser, for removal of this epitaxial layer.

6. The method for manufacturing a semiconductor wafer according to claim 5, wherein
each of the protrusions has a rectangular upper surface,
each of the protrusions has a length of 20 μm to 40 μm in the vertical (c-axis) direction,
one side of the upper surface of each of the protrusions has a length of 50 μm to 100 μm in the horizontal (a-axis) direction, and
the interval at which adjacent ones of the protrusions are formed is 400 μm to 1000 μm.

7. The method for manufacturing a semiconductor wafer according to claim 5, wherein
in the second step, the length of an epitaxial layer containing threading screw dislocation in the vertical (c-axis) direction is equal to or more than twice the length of an epitaxial layer containing no threading screw dislocation in the vertical (c-axis) direction.

8. The method for manufacturing a semiconductor wafer according to claim 7, wherein
in the second step,
an epitaxial layer grown from the protrusion containing threading screw dislocation has a length of about 250 μm in the vertical (c-axis) direction, and a length of about 400 μm in the horizontal (a-axis) direction, and
an epitaxial layer grown from the protrusion containing no threading screw dislocation has a length of about 100 μm in the vertical (c-axis) direction, and a length of about 400 μm in the horizontal (a-axis) direction.

9. The method for manufacturing a semiconductor wafer according to claim 1, wherein
in the third step, the metastable solvent epitaxy process is performed under a condition that enables an epitaxial layer containing no threading screw dislocation to be grown by 4 mm in the horizontal (a-axis) direction.

10. The method for manufacturing a semiconductor wafer according to claim 1, wherein
the protrusions are formed in such a manner that imaginary lines each connecting the centers of adjacent ones of the protrusions form an equilateral triangle when the SiC substrate is viewed in a direction perpendicular to <1-100> direction and to <11-20> direction.

11. The method for manufacturing a semiconductor wafer according to claim 1, wherein
in the second step and the third step, the metastable solvent epitaxy process is performed so as to cause the vertices of hexagonal shapes of epitaxial layers to contact each other.

* * * * *